(12) United States Patent
Cohen et al.

(10) Patent No.: US 9,106,020 B2
(45) Date of Patent: Aug. 11, 2015

(54) MIDPLANE ESPECIALLY APPLICABLE TO AN ORTHOGONAL ARCHITECTURE ELECTRONIC SYSTEM

(71) Applicant: Amphenol Corporation, Wallingford, CT (US)

(72) Inventors: Thomas S. Cohen, New Boston, NH (US); Marc Benard Cartier, Jr., Dover, NH (US); Mark W. Gailus, Concord, MA (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 13/898,752

(22) Filed: May 21, 2013

(65) Prior Publication Data

US 2013/0337665 A1 Dec. 19, 2013

Related U.S. Application Data

(63) Continuation of application No. 13/553,414, filed on Jul. 19, 2012, now Pat. No. 8,444,436, which is a continuation of application No. 12/789,621, filed on May 28, 2010, now Pat. No. 8,226,438, which is a (Continued)

(51) Int. Cl.
*H01R 13/64* (2006.01)
*H01R 13/646* (2011.01)
(Continued)

(52) U.S. Cl.
CPC .......... *H01R 13/646* (2013.01); *H01R 13/6587* (2013.01); *H01R 23/688* (2013.01); *H05K 1/115* (2013.01); *H05K 1/116* (2013.01); *H05K 1/14* (2013.01); *H05K 7/1445* (2013.01); *H01R 13/514* (2013.01); *H01R 13/6471* (2013.01); *H05K 1/0231* (2013.01); *H05K 1/0237* (2013.01); *H05K 3/429* (2013.01); *H05K 2201/044* (2013.01);

(Continued)

(58) Field of Classification Search
CPC .............................. H05K 1/14; H05K 7/1445
USPC ..................................... 439/65, 75
See application file for complete search history.

(56) References Cited

U.S. PATENT DOCUMENTS 4,472,765 A * 9/1984 Hughes .......................... 361/791
4,655,518 A * 4/1987 Johnson et al. ................. 439/62

(Continued)

FOREIGN PATENT DOCUMENTS

EP 0907225 A2 4/1999
EP 1330145 A2 7/2003

(Continued)

*Primary Examiner* — Ross Gushi
(74) *Attorney, Agent, or Firm* — Blank Rome LLP

(57) ABSTRACT

A midplane has a first side to which contact ends of a first differential connector are connected and a second side opposite the first side to which contact ends of a second differential connector are connected. The midplane includes a plurality of vias extending from the first side to the second side, with the vias providing first signal launches on the first side and second signal launches on the second side. The first signal launches are provided in a plurality of rows, with each row having first signal launches along a first line and first signal launches along a second line substantially parallel to the first line. The second signal launches are provided in a plurality of columns, with each column having second signal launches along a third line and second signal launches along a fourth line substantially parallel to the third line.

16 Claims, 11 Drawing Sheets

Related U.S. Application Data continuation of application No. 12/203,270, filed on Sep. 3, 2008, now Pat. No. 7,744,415, which is a continuation of application No. 11/522,530, filed on Sep. 18, 2006, now Pat. No. 7,422,484, which is a continuation of application No. 11/173,927, filed on Jul. 1, 2005, now Pat. No. 7,108,556.

(60) Provisional application No. 60/584,928, filed on Jul. 1, 2004, provisional application No. 60/638,973, filed on Dec. 24, 2004.

(51) Int. Cl.
| | |
|---|---|
| *H05K 1/11* | (2006.01) |
| *H01R 12/50* | (2011.01) |
| *H05K 1/14* | (2006.01) |
| *H05K 7/14* | (2006.01) |
| *H01R 13/6587* | (2011.01) |
| *H01R 13/514* | (2006.01) |
| *H05K 1/02* | (2006.01) |
| *H05K 3/42* | (2006.01) |
| *H01R 13/6471* | (2011.01) |

(52) U.S. Cl.
CPC ............ *H05K 2201/09236* (2013.01); *H05K 2201/09718* (2013.01); *H05K 2201/10189* (2013.01); *H05K 2203/1572* (2013.01)

(56) References Cited

U.S. PATENT DOCUMENTS

| | | | | |
|---|---|---|---|---|
| 4,674,812 A | * | 6/1987 | Thom et al. | 439/78 |
| 4,686,607 A | * | 8/1987 | Johnson | 361/788 |
| 4,703,394 A | * | 10/1987 | Petit et al. | 361/790 |
| 4,708,660 A | * | 11/1987 | Claeys et al. | 439/65 |
| 4,838,798 A | * | 6/1989 | Evans et al. | 439/61 |
| 4,876,630 A | * | 10/1989 | Dara | 361/791 |
| 5,066,236 A | * | 11/1991 | Broeksteeg | 439/79 |
| 5,259,773 A | * | 11/1993 | Champion et al. | 439/108 |
| 5,296,748 A | * | 3/1994 | Wicklund et al. | 327/565 |
| 5,335,146 A | * | 8/1994 | Stucke | 361/785 |
| 5,352,123 A | * | 10/1994 | Sample et al. | 439/61 |
| 5,429,520 A | * | 7/1995 | Morlion et al. | 439/108 |
| 5,429,521 A | * | 7/1995 | Morlion et al. | 439/108 |
| 5,870,528 A | * | 2/1999 | Fukuda | 700/245 |
| 5,887,158 A | * | 3/1999 | Sample et al. | 716/137 |
| 5,931,686 A | * | 8/1999 | Sasaki et al. | 439/78 |
| 6,163,464 A | * | 12/2000 | Ishibashi et al. | 361/788 |
| 6,328,572 B1 | * | 12/2001 | Higashida et al. | 439/61 |
| 6,335,867 B1 | * | 1/2002 | Ishibashi et al. | 361/788 |
| 6,350,134 B1 | | 2/2002 | Fogg et al. | |
| 6,379,188 B1 | | 4/2002 | Cohen et al. | |
| 6,392,142 B1 | * | 5/2002 | Uzuka et al. | 174/541 |
| 6,409,543 B1 | * | 6/2002 | Astbury et al. | 439/607.07 |
| 6,435,913 B1 | | 8/2002 | Billman | |
| 6,461,202 B2 | * | 10/2002 | Kline | 439/701 |
| 6,503,103 B1 | | 1/2003 | Cohen et al. | |
| 6,506,076 B2 | * | 1/2003 | Cohen et al. | 439/607.09 |
| 6,517,360 B1 | | 2/2003 | Cohen | |
| 6,527,587 B1 | * | 3/2003 | Ortega et al. | 439/607.05 |
| 6,528,737 B1 | * | 3/2003 | Kwong et al. | 174/262 |
| 6,538,899 B1 | * | 3/2003 | Krishnamurthi et al. | 361/788 |
| 6,540,522 B2 | * | 4/2003 | Sipe | 439/61 |
| 6,541,712 B1 | * | 4/2003 | Gately et al. | 174/266 |
| 6,585,526 B2 | * | 7/2003 | Gillenberg et al. | 439/65 |
| 6,608,762 B2 | * | 8/2003 | Patriche | 361/788 |
| 6,633,490 B2 | * | 10/2003 | Centola et al. | 361/785 |
| 6,663,427 B1 | | 12/2003 | Billman et al. | |
| 6,663,429 B1 | | 12/2003 | Korsunsky et al. | |
| 6,690,584 B2 | * | 2/2004 | Uzuka et al. | 361/796 |
| 6,705,895 B2 | * | 3/2004 | Hasircoglu | 439/607.07 |
| 6,717,825 B2 | * | 4/2004 | Volstorf | 361/803 |
| 6,736,647 B1 | * | 5/2004 | Gillenberg | 439/65 |
| 6,743,057 B2 | | 6/2004 | Davis et al. | |
| 6,749,439 B1 | * | 6/2004 | Potter et al. | 439/65 |
| 6,764,341 B2 | * | 7/2004 | Lappoehn | 439/607.05 |
| 6,776,659 B1 | | 8/2004 | Stokoe et al. | |
| 6,796,807 B2 | * | 9/2004 | Olzak et al. | 439/76.1 |
| 6,808,420 B2 | * | 10/2004 | Whiteman et al. | 439/607.08 |
| 6,816,486 B1 | * | 11/2004 | Rogers | 370/387 |
| 6,817,870 B1 | * | 11/2004 | Kwong et al. | 439/74 |
| 6,872,085 B1 | | 3/2005 | Cohen et al. | |
| 6,890,184 B2 | * | 5/2005 | Doblar et al. | 439/65 |
| 6,899,566 B2 | * | 5/2005 | Kline et al. | 439/607.56 |
| 6,903,939 B1 | * | 6/2005 | Chea et al. | 361/788 |
| 6,913,490 B2 | * | 7/2005 | Whiteman et al. | 439/607.05 |
| 6,945,787 B2 | * | 9/2005 | Matsuo | 439/65 |
| 6,960,103 B2 | * | 11/2005 | Tokunaga | 439/607.13 |
| 6,971,916 B2 | | 12/2005 | Tokunaga et al. | |
| 7,050,307 B2 | * | 5/2006 | Doblar et al. | 361/736 |
| 7,057,115 B2 | * | 6/2006 | Clink et al. | 174/255 |
| 7,094,102 B2 | | 8/2006 | Cohen et al. | |
| 7,108,556 B2 | * | 9/2006 | Cohen et al. | 439/607.08 |
| 7,133,292 B2 | * | 11/2006 | Uzuka et al. | 361/728 |
| 7,193,861 B2 | * | 3/2007 | Uzuka et al. | 361/786 |
| 7,322,855 B2 | | 1/2008 | Mongold et al. | |
| 7,422,484 B2 | * | 9/2008 | Cohen et al. | 439/607.05 |
| 7,540,744 B1 | * | 6/2009 | Minich | 439/65 |
| 7,643,286 B2 | * | 1/2010 | Hirai et al. | 361/679.5 |
| 7,802,046 B2 | * | 9/2010 | Kowalski et al. | 710/313 |
| 7,837,505 B2 | * | 11/2010 | Minich et al. | 439/607.08 |
| 7,929,310 B2 | * | 4/2011 | Belady et al. | 361/735 |
| 8,444,436 B1 | * | 5/2013 | Cohen et al. | 439/607.08 |
| 2001/0046810 A1 | | 11/2001 | Cohen et al. | |
| 2002/0086582 A1 | * | 7/2002 | Nitta et al. | 439/608 |
| 2002/0090841 A1 | * | 7/2002 | Gillenberg et al. | 439/65 |
| 2002/0111068 A1 | | 8/2002 | Cohen et al. | |
| 2002/0111069 A1 | | 8/2002 | Astbury et al. | |
| 2002/0123266 A1 | | 9/2002 | Ramey et al. | |
| 2002/0168898 A1 | | 11/2002 | Billman et al. | |
| 2002/0181215 A1 | * | 12/2002 | Guenthner | 361/784 |
| 2002/0181217 A1 | * | 12/2002 | Patriche | 361/796 |
| 2003/0003803 A1 | | 1/2003 | Billman et al. | |
| 2003/0008561 A1 | * | 1/2003 | Lappoehn | 439/608 |
| 2003/0022555 A1 | | 1/2003 | Vicich et al. | |
| 2003/0143894 A1 | * | 7/2003 | Kline et al. | 439/608 |
| 2003/0220021 A1 | * | 11/2003 | Whiteman et al. | 439/608 |
| 2004/0043661 A1 | * | 3/2004 | Okada et al. | 439/608 |
| 2004/0203259 A1 | * | 10/2004 | Doblar et al. | 439/65 |
| 2004/0224559 A1 | | 11/2004 | Nelson et al. | |
| 2004/0259419 A1 | | 12/2004 | Payne et al. | |
| 2005/0020135 A1 | * | 1/2005 | Whiteman et al. | 439/608 |
| 2005/0070160 A1 | * | 3/2005 | Cohen et al. | 439/608 |
| 2005/0148239 A1 | | 7/2005 | Hull et al. | |
| 2005/0161254 A1 | | 7/2005 | Clink et al. | |
| 2005/0215121 A1 | * | 9/2005 | Tokunaga | 439/608 |
| 2006/0019538 A1 | | 1/2006 | Davis et al. | |
| 2006/0024983 A1 | * | 2/2006 | Cohen et al. | 439/61 |
| 2006/0024984 A1 | * | 2/2006 | Cohen et al. | 439/61 |
| 2006/0073709 A1 | * | 4/2006 | Reid | 439/65 |
| 2006/0228912 A1 | * | 10/2006 | Morlion et al. | 439/65 |

FOREIGN PATENT DOCUMENTS

| | | |
|---|---|---|
| WO | 03065511 A2 | 8/2003 |
| WO | 2005081596 A2 | 9/2005 |

* cited by examiner

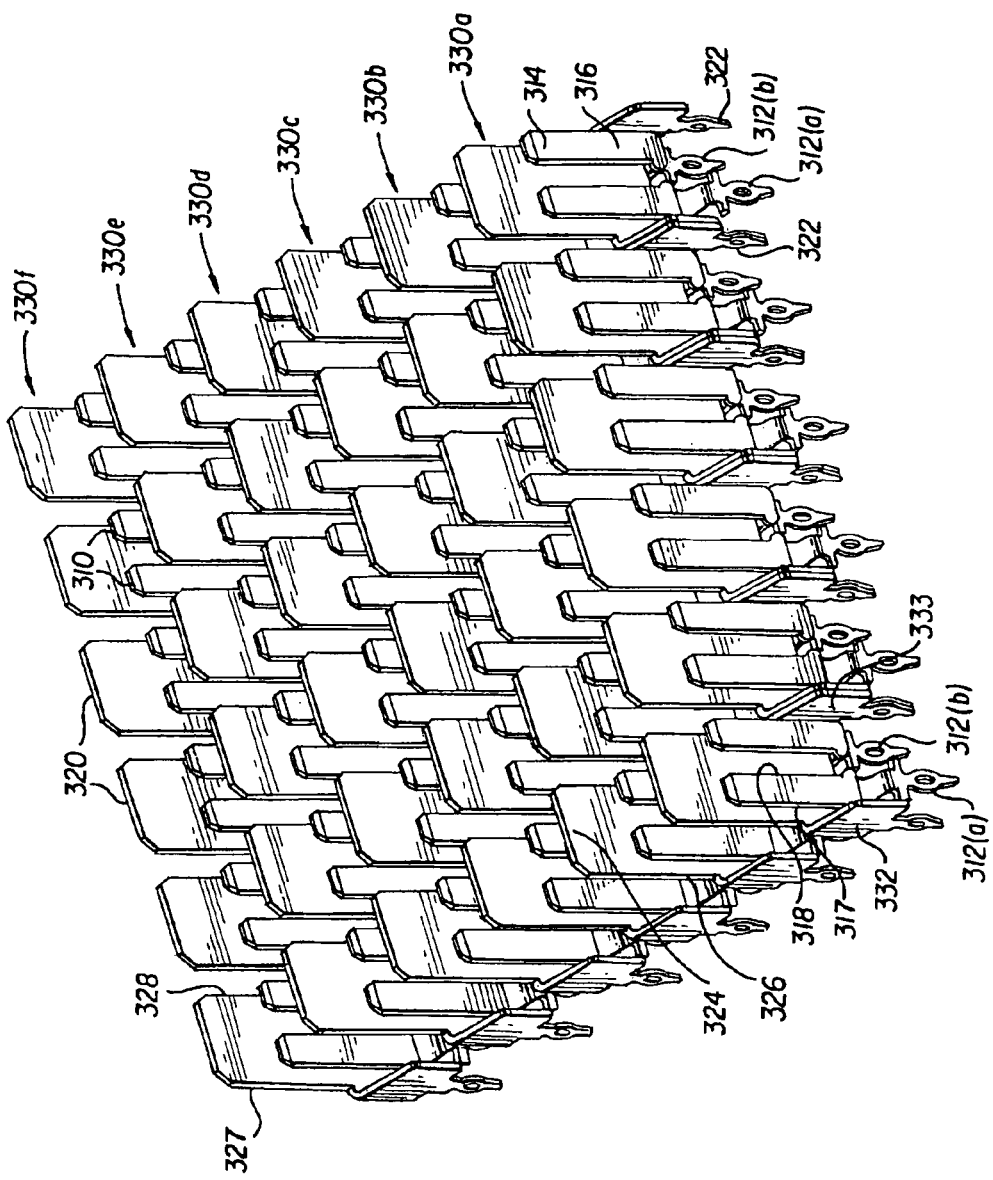

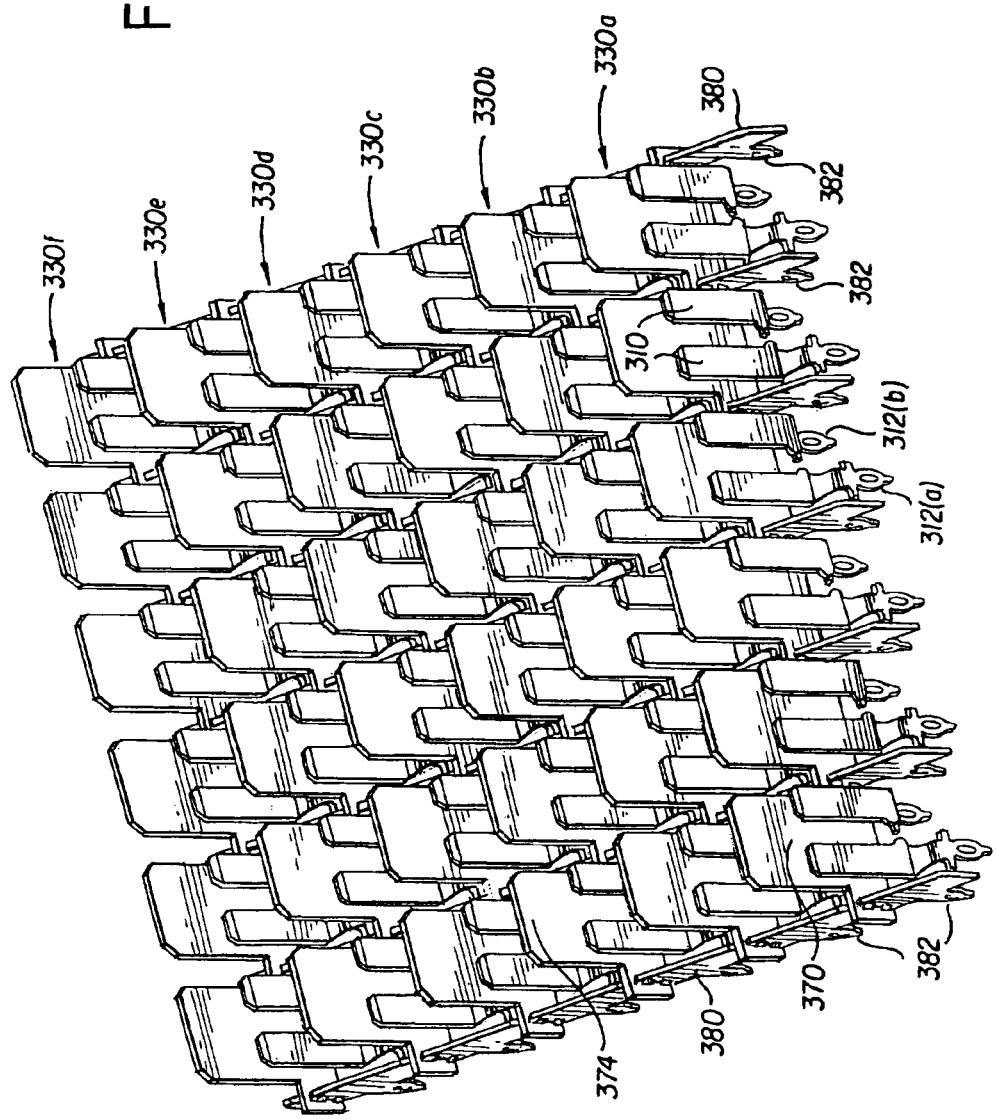

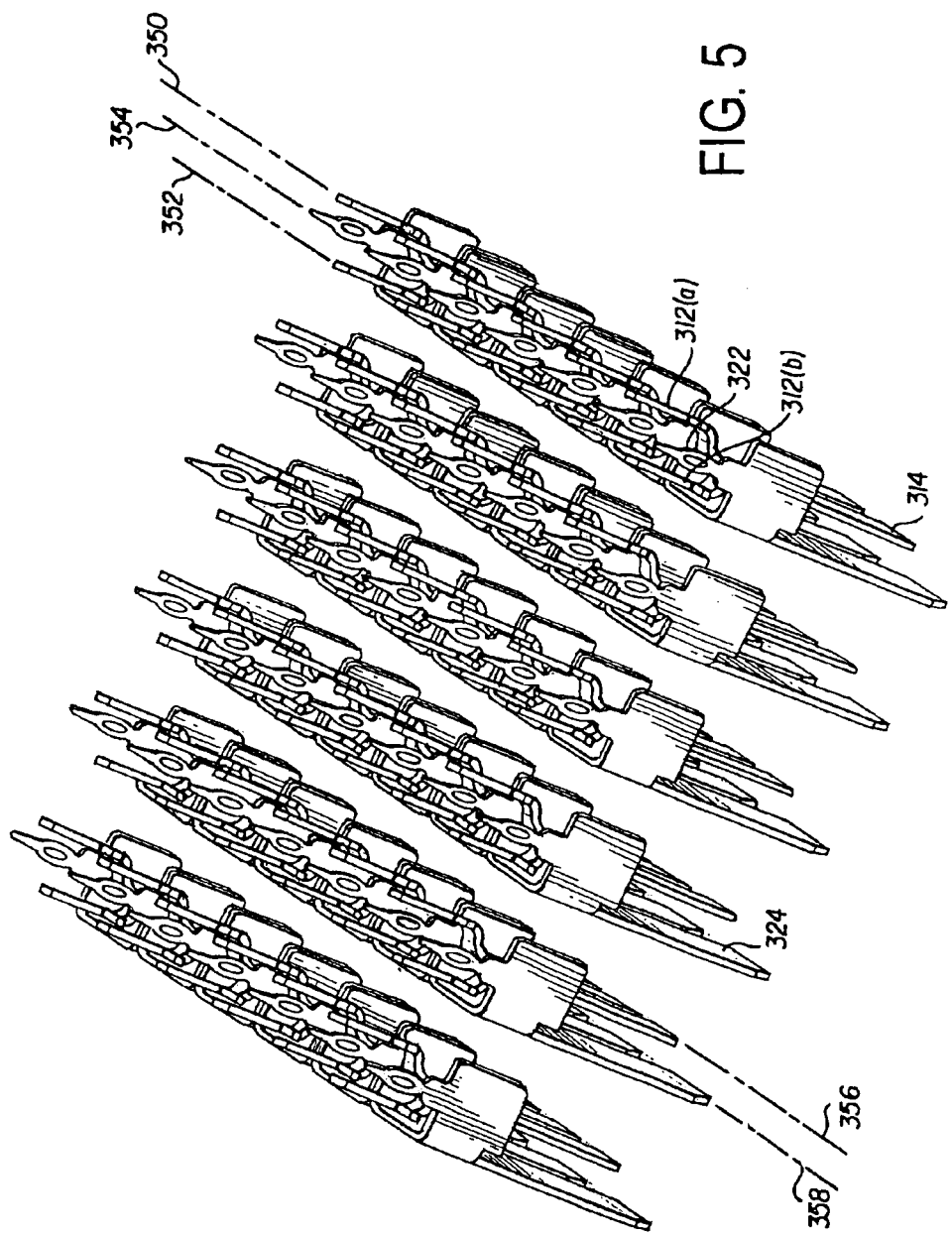

MIDPLANE ESPECIALLY APPLICABLE TO AN ORTHOGONAL ARCHITECTURE ELECTRONIC SYSTEM

CROSS-REFERENCE TO RELATED APPLICATIONS

This patent application is a continuation of U.S. Pat. No. 8,444,436, filed Jul. 19, 2012, which is a is a continuation of U.S. Pat. No. 8,226,438, filed May 28, 2010, which is a continuation application of U.S. Pat. No. 7,744,415, filed Sep. 3, 2008, which is a continuation of U.S. Pat. No. 7,422,484, filed Sep. 18, 2006, which is a continuation of U.S. Pat. No. 7,108,556, filed Jul. 1, 2005, which claims priority to U.S. Provisional Patent Application No. 60/584,928, filed Jul. 1, 2004, and U.S. Provisional Patent Application No. 60/638,973, filed Dec. 24, 2004, the disclosures of which are incorporated by reference herein.

BACKGROUND OF THE INVENTION

Modern electronic systems are typically assembled from multiple printed circuit boards. Such printed circuit boards, which are commonly referred to as "daughter cards", contain components thereon, such as integrated circuits. Each daughter card also typically includes one or more connectors that allow the components on the daughter card to communicate with components on the other daughter cards in the system.

One way to interconnect the daughter cards in an electronic system is to utilize a midplane. A midplane is a printed circuit board, typically larger than the daughter cards, to which the daughter cards are connected—by way of connectors on both the daughter cards and the midplane—and that provides conductive paths therein. The conductive paths, which are also referred to as "signal traces", interconnect and provide communication between the daughter cards in the system. A midplane, as the name implies, provides connectors on both sides, allowing daughter cards to be connected on both sides of the midplane. The midplane can route signals between daughter cards connected on the same side of the midplane or can cross-connect a daughter card on one side of the midplane with a daughter card on the other side of the midplane.

In order to connect a connector to the midplane, holes are conventionally drilled through the midplane. The holes, which are also referred to as "vias", electrically connect to signal traces in the midplane. The inside walls of the vias are typically plated with a conductive material, such as metal, to provide electrical conductivity. The connector is provided with contact ends, such as press-fit contact tails or SMT (surface mount technique) contact tails, for connecting to the vias.

As electronic systems have become smaller, faster and more complex, this has generally required that midplanes provide more vias and signal traces without increasing in size, or in many instances, while actually decreasing in size. This has introduced significant difficulties in designing and fabricating midplanes, as well as significant difficulties in dealing with electrical noise and other electrical characteristics. Electrical noise is usually considered any undesirable electrical energy in an electronic system, including but not limited to, reflections, electromagnetic interference, mode conversions and unwanted coupling, such as cross-talk.

The trend for smaller, faster and more complex electronic systems has also required connectors to carry more and faster data signals in a smaller space without degrading the electrical characteristics of the signal. Connectors can be made to carry more signals in less space by placing signal conductors in a connector closer together. A major difficulty with placing signal conductors closer together is that electrical noise between the signal conductors increases as the distance between signal conductors decreases and as the speed of the signals increases. In addition, as frequency content increases, there is a greater possibility of energy loss. Energy loss may be attributed to impedance discontinuities, mode conversion, leakage from imperfect shielding, or undesired coupling to other conductors (crosstalk). Therefore, connectors are designed to control the mechanisms that enable energy loss. Conductors composing transmission paths are designed to match system impedance, enforce a known propagating mode of energy, minimize eddy currents, and isolate alternate transmission paths from one another. One example of controlling energy loss is the placement of a conductor connected to a ground placed adjacent to a signal contact element to determine an impedance and minimize energy loss in the form of radiation.

One way to control electrical noise in a connector is to utilize differential signals. Differential signals are signals represented by a pair of signal conductors, called a "differential pair". The voltage difference between the pair of signal conductors represents the signal. If electrical noise is electromagnetically coupled to a differential pair, the effect on each signal conductor of the pair should be similar. This renders a differential pair less sensitive to electrical noise as compared with a single signal conductor. However, use of a differential connector, especially in a midplane system architecture, introduces further difficulties as vias corresponding to the differential pair on either side of the midplane must each be electrically connected in the midplane and signal traces can only be routed between adjacent differential pairs.

What is desired, therefore, is to provide a midplane and a differential connector designed for such a midplane that addresses the difficulties described above.

SUMMARY OF THE INVENTION

In one embodiment of a midplane in accordance with the invention, the midplane has a first side to which contact ends of a first differential connector are connected and a second side opposite the first side to which contact ends of a second differential connector are connected. The midplane includes a plurality of vias extending from the first side to the second side, with the vias providing first signal launches on the first side and second signal launches on the second side. The first signal launches are provided in a plurality of rows for electrically connecting to the contact ends of the first differential connector, with each row having first signal launches along a first line and first signal launches along a second line substantially parallel to the first line. The first signal launches along the first and second lines are offset so that first signal launches along the first line and adjacent first signal launches along the second line correspond to differential pairs of the first differential connector. The second signal launches are provided in a plurality of columns for electrically connecting to the contact ends of the second differential connector, with each column having second signal launches along a third line and second signal launches along a fourth line substantially parallel to the third line. The second signal launches along the third and fourth lines are offset so that second signal launches along the third line and adjacent second signal launches along the fourth line correspond to differential pairs of the second differential connector.

BRIEF DESCRIPTION OF THE DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 4 is a perspective view showing rows of differential pair signal conductors and corresponding ground conductors of the differential midplane connector shown in FIG. 3 according to an embodiment of the present invention;

FIG. 4A is an alternative embodiment of FIG. 4, showing rows of differential pair signal conductors and corresponding ground conductors of the differential midplane connector shown in FIG. 3;

FIG. 5 is a bottom view showing first contact ends of the differential pair signal conductors and corresponding ground conductors of the differential midplane connector shown in FIG. 4;

DETAILED DESCRIPTION OF THE INVENTION

Figure 1:
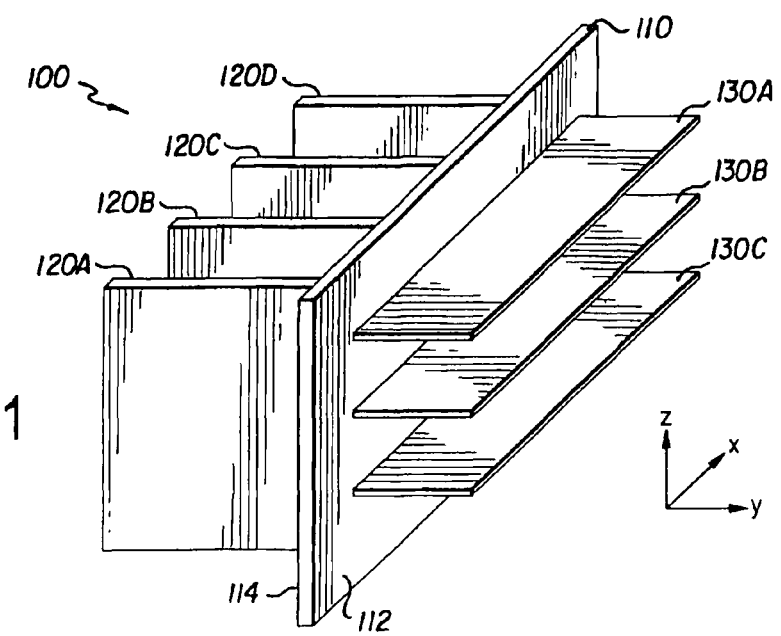
FIG. 1 is a perspective view of an electronic system utilizing a midplane according to an embodiment of the present invention.

This invention is not limited in its application to the details of construction and the arrangement of components set forth in the following description or illustrated in the drawings. The invention is capable of other embodiments and of being practiced or of being carried out in various ways. Also, the phraseology and terminology used herein is for the purpose of description and should not be regarded as limiting. The use of "including," "comprising," "having," "containing," "involving," and variations thereof herein, is meant to encompass the items listed thereafter and equivalents thereof as well as additional items.

Referring to FIG. 1, there is shown a sketch of an electronic system 100 which utilizes a midplane 110 in accordance with the present invention. The midplane has a first side 112 and a second side 114. Daughtercards 120A, 120B, 120C and 120D are electrically connected to the midplane 110 on the second side 114. Daughtercards 130A, 130E and 130C are electrically connected to the midplane 110 on the first side 112. Note that the daughtercards 130A-130C on the first side 112 of the midplane 110 are orthogonal in orientation to the daughtercards 120A-120D on the second side 114 of the midplane 110. The concepts embodied in the present invention are especially applicable to such an orthogonal architecture electronic system.

Figure 2:
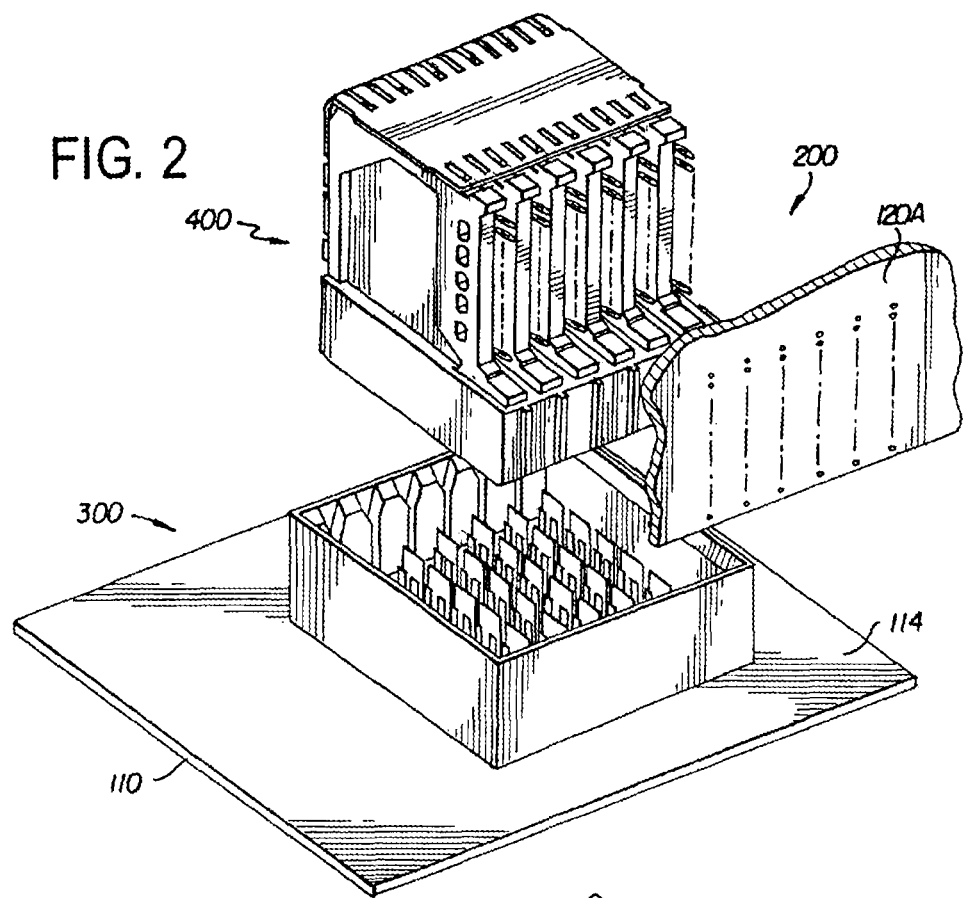
FIG. 2 is a partially exploded view of a differential electrical connector assembly according to an embodiment of the present invention that may be used in the electronic system of FIG. 1.

While not shown in the sketch of FIG. 1, daughtercards 120A-120D and 130A-130C are electrically connected to the midplane 110 by electrical connector assemblies. FIG. 2 shows a preferred embodiment of such an electrical connector assembly 200 in accordance with the present invention. Midplane 110 includes multiple signal traces that route signals between daughtercards 120A-120D and 130A-130C of the electronic system 100. The midplane 110 is described in greater detail with respect to FIG. 7. It should be noted that the number of daughtercards 130A-130C shown on the first side 112 and the number of daughtercards 120A-120D shown on the second side 114 are for illustrative purposes only, and the actual number of daughtercards connected to the midplane 110 may vary depending upon the electronic system.

FIG. 2 shows the electrical connector assembly 200 that may be used to connect the daughtercards 120A-120D and 130A-130C to the midplane 110 of FIG. 1. The electrical connector assembly 200 is preferably a differential electrical connector assembly. The electrical connector assembly 200 includes a first differential electrical connector 300, which in the illustration connects to the midplane 110, and a second differential electrical connector 400, which connects to one of the daughtercards (daughtercard 120A is referenced for illustration in FIG. 2). Typically, one or more second connectors 400 would be connected to each daughtercard, with the corresponding number of first connectors 300 connected to the midplane 110.

Figure 3:
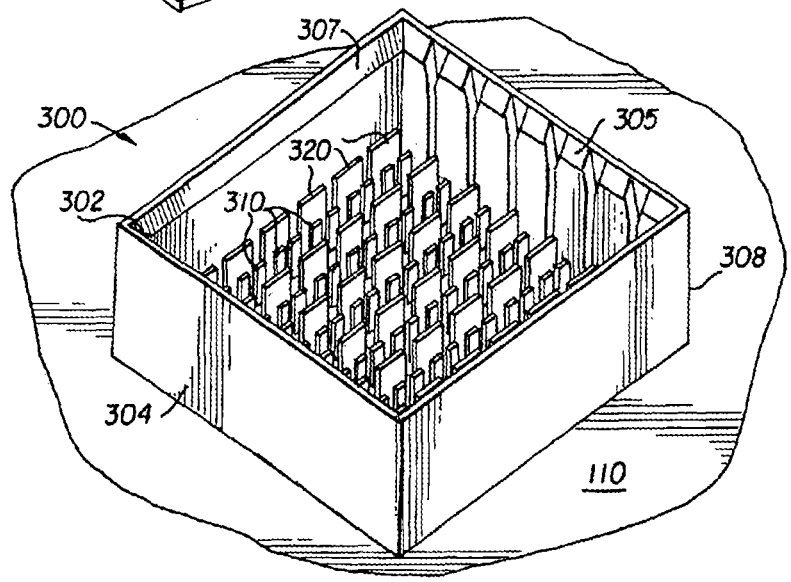
FIG. 3 is a perspective view of a differential midplane connector shown in FIG. 2.

FIG. 3 shows a differential midplane connector 300 having a housing 302, which is preferably made of an insulative material. The housing 302 has sidewalls 304, 305, end walls 307, 308 and a base (not numbered). Disposed in the base of the housing 302 are a plurality of signal conductors 310 provided as differential pairs and a plurality of ground conductors 320, with each ground conductor 320 corresponding to a differential pair of signal conductors 310 and positioned adjacent thereto. As shown in greater detail in FIGS. 4, 4A and 5, the signal conductors 310 and the ground conductors 320 are provided in a plurality of rows. For exemplary purposes only, six rows 330a-330f are shown in FIG. 4, with each of the rows having six differential pairs of signal conductors 310 and six corresponding ground conductors 320. Note that the number of rows, the number of signal conductors 310 for each row, and the number of ground conductors 320 for each row may be any number as desired. However, as will become more apparent in connection with the description of the midplane 110 in FIG. 8, it is preferable to pre-select the number of rows, the number of signal conductors 310 for each row, and the number of ground conductors 320 for each row to ensure a substantially square footprint for connecting to the midplane 110.

Each signal conductor 310 has a first contact end 312 connectable to the midplane 110, a second contact end 314, and an intermediate portion 316 therebetween having a first width as measured from first edge 317 to second edge 318 of the signal conductor 310. Each ground conductor 320 has a first contact end 322 connectable to the midplane 110, a second contact end 324, and an intermediate portion 326 therebetween having a second width as measured from first edge 327 to second edge 328 of the ground conductor 320. Preferably, the second width of the intermediate portion 326 of the ground conductor 320 is at least twice the first width of the intermediate portion 316 of the signal conductor 310. This allows the ground conductor 320 to provide sufficient shielding to the corresponding differential pair of signal conductors 310 from the electromagnetic effects of signal conductors in adjacent rows.

In the preferred embodiment, the first contact end 322 of the ground conductor 320 includes a first contact arm 332 and a second contact arm 333 spaced from the first contact arm 332. The first and second contact arms 332, 333 extend in the direction of the corresponding differential pair of signal conductors 310. Preferably, the first and second contact arms 332, 333 extend beyond the plane of the corresponding signal conductors 310. This allows the contact arms 332, 333 to provide sufficient shielding to the corresponding differential pair of signal conductors 310 from the electromagnetic effects of adjacent signal conductors in the row. Note that for each of the plurality of rows 330a-330f, the first contact arm 332 of a ground conductor 320 is proximal and substantially parallel to the second contact arm 333 of an adjacent ground conductor 320, except at an end of a row.

The drawings show that the first contact end 312 of each signal conductor 310 and the first contact end 322 of each ground conductor 320 as press-fit contact tails. However, it should be apparent to one of ordinary skill in the art that the first contact ends 312, 322 may take any known form, e.g., pressure-mount contacts, paste-in-hole solder attachment, contact tails adapted for soldering, etc., for connecting to the midplane 110. In the preferred embodiment, the press-fit contact tails of the signal conductors 310 are oriented in a first direction and the press-fit contact tails of the ground conductors 320 are oriented in a second direction substantially perpendicular to the first direction.

Referring to FIGS. 4 and 5, each differential pair of signal conductors 310 of a row, e.g., row 330a, has one first contact end 312(a) that lies along a first line 350 and is parallel to the plurality of rows and an other first contact end 312(b) that lies along a second line 352 and is parallel to and spaced from the first line 350. The first contact end 322 of the corresponding ground conductor 320 preferably lies along a third line 354 that is parallel to and spaced from the first and second lines 350, 352. In the preferred embodiment, the third line 354 is positioned between the first and second lines 350, 352. This configuration, as described in greater detail with respect to the description of the midplane 110 in FIG. 8, provides a substantially square footprint for connecting to the midplane 110.

For each differential pair of signal conductors 310 of a row, the second contact ends 314 lie along a fourth line 356. The fourth line 356 is preferably parallel to the plurality of rows. The second contact ends 324 of the ground conductors 320 lie along a fifth line 358 that is parallel to and spaced from the fourth line 356.

Referring now to FIG. 4A, there is shown an alternative embodiment of FIG. 4. In this embodiment, the signal conductors 310 are as shown in FIG. 4. However, instead of providing a ground conductor 320 corresponding to each differential pair of signal conductors 310 as illustrated in FIG. 4, there is provided a single first ground conductor 370 for each row of signal conductors 310. The first ground conductor 370 extends substantially the length of the corresponding row, where the rows are referenced by 330a'-330f' in FIG. 4A. Each first ground conductor 370 has a plurality of mating contact ends 374 that are connectable to the corresponding ground conductor of the second differential electrical connector 400. The number of mating contact ends 374 of each first ground conductor 370 is preferably the same as the number of differential pairs of signal conductors 310 of each corresponding row. In the example illustrated in FIG. 4A, there are six mating contact ends 374 corresponding to the six differential pairs of signal conductors 310.

A plurality of second ground conductors 380 are also provided, with each second ground conductor 380 electrically connected to each first ground conductor 370 and oriented substantially perpendicular to the first ground conductors 370. Each second ground conductor 380 extends substantially the length of the plurality of rows 330a'-330f', and each second ground conductor 380 is positioned between adjacent differential pairs of signal conductors 310 of each row 330a'-330f'. The second ground conductors 380 are each provided with a first contact end connectable to the midplane 110. Preferably, the first contact end of each second ground conductor 380 includes a plurality of contact pins 382 that are oriented perpendicularly to the orientation of the contact pins 312 of the signal conductors 310. Note that for each row 330a'-330f', there is a contact pin 382 of a second ground conductor 380 adjacent each differential pair of signal conductors 310. And for each row 330a'-330f', the contact pins 382 for the row lie along a third line 354, as described with respect to FIG. 5. Other suitable configurations of signal conductors 310 and ground conductors 320 may also be used, as will be apparent to those of ordinary skill in the art.

Figure 6:
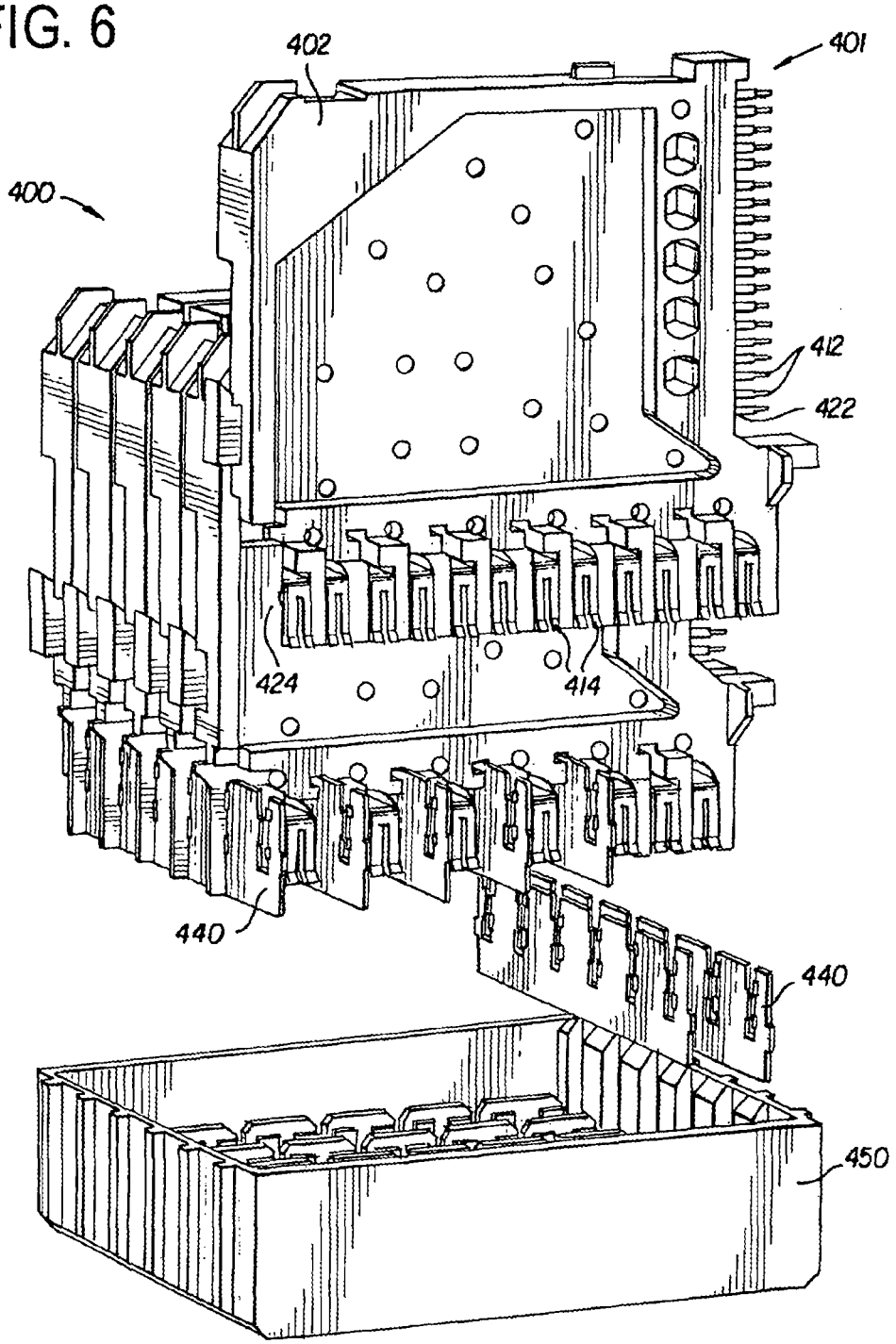
FIG. 6 is a perspective view of a differential daughtercard connector according to an embodiment of the present invention shown in FIG. 2, with a wafer separated from the connector for clarity.
Figure 7:
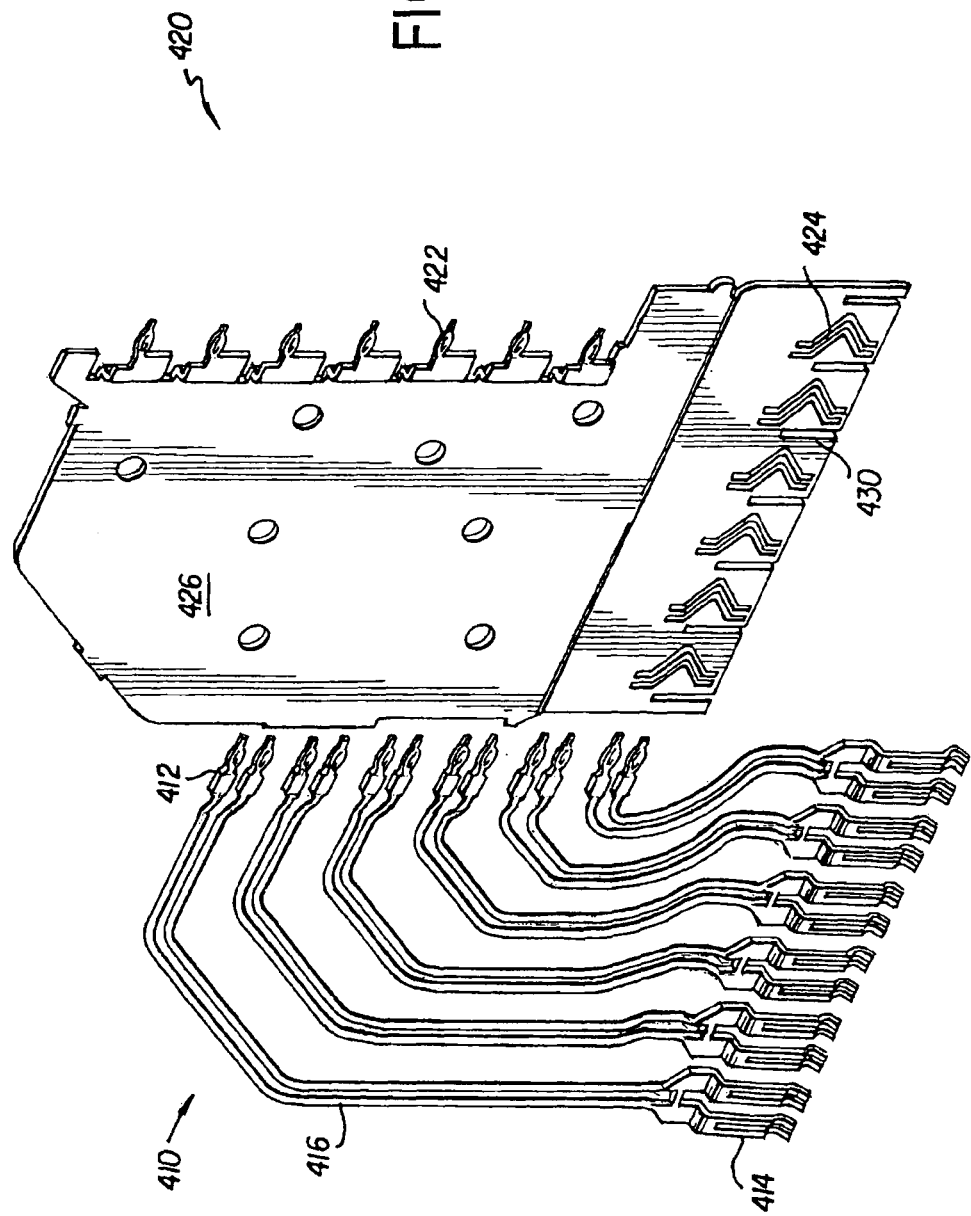
FIG. 7 is an exploded view of the wafer of FIG. 6 showing only the differential pair signal conductors and corresponding ground conductor.

Referring now to FIGS. 6 and 7, there is shown the second differential electrical connector 400 of the electrical connector assembly 200 which mates to the first differential electrical connector 300 on one side and electrically connects to one of the daughtercards (e.g., daughtercard 130C) on another side. The second differential electrical connector 400 includes a plurality of wafers 401, where each of the plurality of wafers 401 corresponds to one of the plurality of rows (e.g., 330a-330f of FIG. 4) of the first differential electrical connector 300. Thus, the number of wafers 401 of the second differential electrical connector 400 is the same as the number of rows of the first differential electrical connector 300. Each wafer 401 includes a housing 402, which is preferably made of an insulative material. A plurality of signal conductors 410 provided as differential pairs are held in the housing 402 with a corresponding ground conductor 420 positioned adjacent thereto. The signal conductors 410 and the corresponding ground conductor 420 are shown in greater detail in FIG. 7. Note that the number of differential pairs of signal conductors 310 provided in a row of the first differential electrical connector 300 is the same as the number of differential pairs of signal conductors 410 provided in the corresponding wafer 401 of the second differential electrical connector 400.

Each signal conductor 410 has a first contact end 412 connectable to one of the daughtercards (e.g., 120A-120D, 130A-130C of FIG. 1), a second contact end 414 connectable to the second contact end 314 of a corresponding signal conductor 310 of the first differential electrical connector 300, and an intermediate portion 416 therebetween. Each ground conductor 420 has a first contact end 422 connectable to the daughtercard, a second contact end 424 connectable to the second contact ends 324 of the corresponding ground conductors 320 of the first differential electrical connector 300, and an intermediate portion 426 therebetween. The drawings show the first contact end 412 of each signal conductor 410 and the first contact end 422 of the ground conductor 420 as press-fit contact tails. However, it should be apparent to one of ordinary skill in the art that the first contact ends 412, 422 may take any form, e.g., pressure-mount contacts, paste-in-hole solder attachment, contact tails adapted for soldering, etc., for connecting to the daughtercard.

In the preferred embodiment, the ground conductor 420 is a ground shield that provides electrical shielding to the corresponding signal conductors 410 of the wafer 401. However, a plurality of ground conductors may be utilized instead of a single ground shield, as known in the art. Provided in the second contact end 424 of the ground shield 420 are slits 430. Preferably, the slits 430 are positioned between adjacent differential pairs of signal conductors 410.

Each of the slits 430 is configured to receive and electrically connect to a ground conductor 440 that is oriented perpendicular to the ground conductor 420 of the wafer 401. Note that the ground conductor 440 is preferably configured as a ground strip, as shown in FIG. 6. Each ground strip 440 electrically connects to each ground conductor 420 of the wafers 401. In this manner, the ground strips 440 electrically separate adjacent second contact ends 414 of differential pairs of signal conductors 410. The grid-like shielding pattern formed by the ground shields 420 and the ground strips 440 provides effective electrical shielding (e.g., from electrical noise) for the differential pairs of signal conductors 410. This grid-like shielding pattern formed by the ground shields 420 and the ground strips 440 is housed in a shroud 450, which is preferably insulative.

Figure 8A:
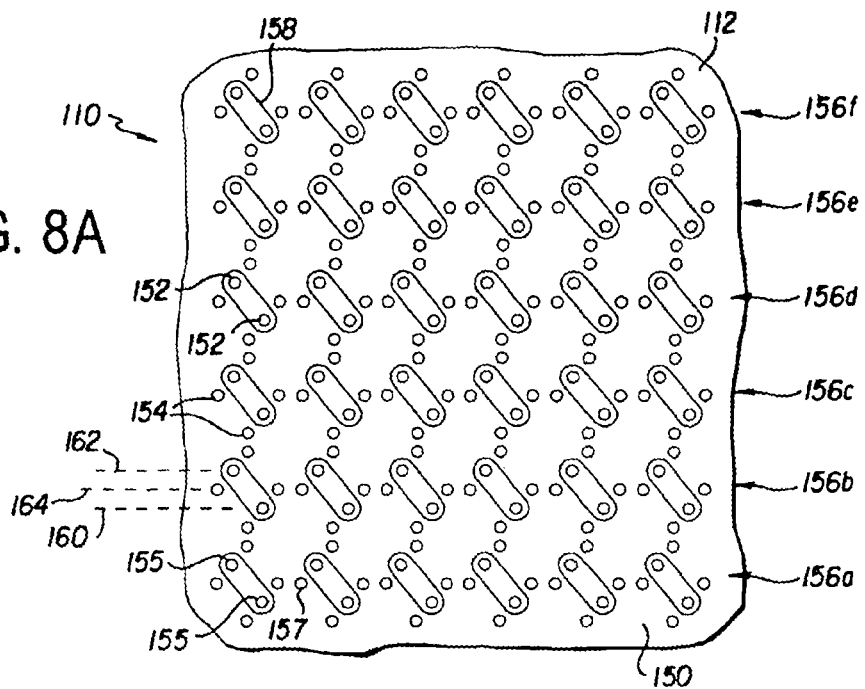
FIG. 8A is a schematic top view of a portion of one side of the midplane of FIG. 1, with a part of the surface removed to show a ground plane layer.
Figure 8B:
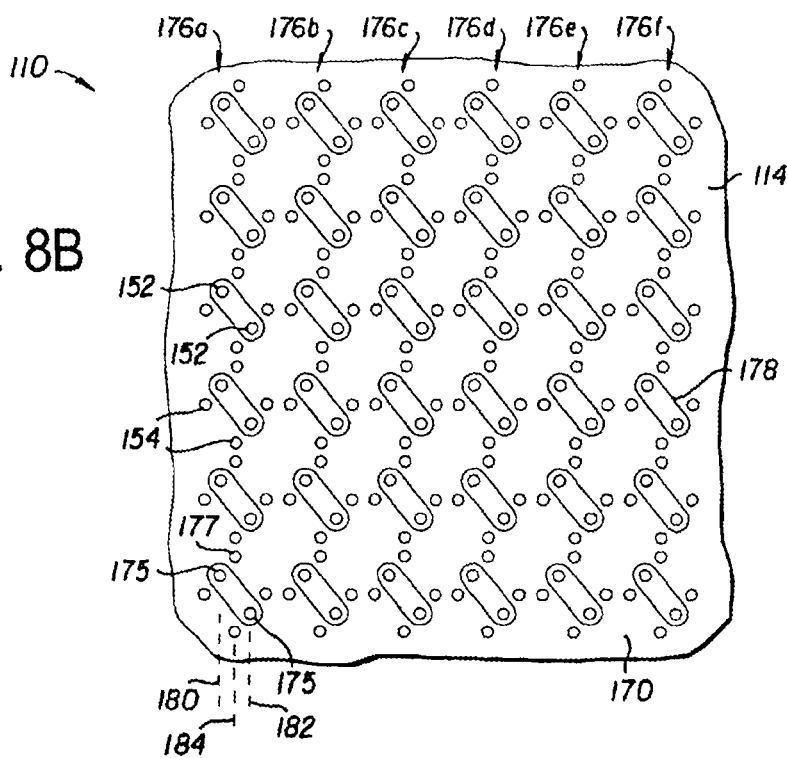
FIG. 8B is a schematic top view of a portion (the same portion as FIG. 8A) of the other side of the midplane of FIG. 1, with a part of the surface removed to show a ground plane layer.

Referring now to FIG. 8A, there is shown a top view of a portion of the first side 112 of the midplane 110 of FIG. 1, with a part of the surface removed to reveal a ground plane layer 150. FIG. 8B shows a top view of the portion (same portion as in FIG. 5A and viewed from the same perspective as FIG. 8A) of the second side 114 of the midplane 110 of FIG. 1, with a part of the surface removed to reveal a ground plane layer 170. The portion of the midplane 110 shown in FIGS. 8A and 8B correspond to the footprint of a differential electrical connector, such as the differential electrical connector 300, that connects to the midplane 110. Note that the portion of the first side 112 of the midplane 110 shown in FIG. 8A provides a similar interface for a differential electrical connector as the portion of the second side 114 of the midplane 110 shown in FIG. 8B.

As known in the art, a midplane is generally a multi-layer printed circuit board formed of multiple layers of dielectric substrates with signal traces or planes formed on one or more of the dielectric layers. Further, the multi-layer printed circuit board will typically have a ground plane formed on one or more of the dielectric layers. Vias generally extend between layers of a multi-layer printed circuit board. Vias which extend through all layers of a multi-layer printed circuit board are sometimes referred to as through-holes. The vias are usually formed after the layers of substrates are formed into a printed circuit board. Conductive vias generally intersect signal traces on different layers. Conductive vias also interconnect components mounted on the printed circuit board to signal traces on inner layers of the printed circuit board.

FIG. 8A shows the ground plane 150, which is formed on one of the dielectric layers of the midplane 110. FIG. 5B shows the ground plane 170, which is formed on one of the dielectric layers of the midplane 110. Typically, the midplane 110 will have more than one ground plane, and ground planes 150, 170 will be different ground planes. However, the ground planes 150, 170 may be the same ground plane without departing from the scope of the present invention. The midplane 110 has a plurality of vias 152, 154 extending from the first side 112 to the second side 114. Thus, vias 152, 154 are through-hole vias. The vias 152 are signal connecting conductive vias and the vias 154 are ground connecting conductive vias. Note that the signal connecting conductive vias 152 on the first side 112 of the midplane 110 provide first signal launches 155 for differential pairs of the differential connector connected to the first side 112 and the signal connecting conductive vias 152 on the second side 114 of the midplane 110 provide second signal launches 175 for differential pairs of the differential connector connected to the second side 114. The ground connecting conductive vias 154 on the first side 112 of the midplane 110 provide first ground launches 157 for differential pairs of the differential connector connected to the first side 112 and the ground connecting conductive vias 154 on the second side 114 of the midplane 110 provide second ground launches 177 for differential pairs of the differential connector connected to the second side 114.

The first signal launches 155 are provided in a plurality of rows 156a-156f, as shown in FIG. 8A, for electrically connecting to a differential connector. In the example of FIG. 8A, the six rows 156a-156f shown correspond to the six rows 330a-330f of differential pairs of signal conductors 310 of the first differential electrical connector 300 shown in FIGS. 4 and 5. Each signal connecting conductive via 152 of a pair corresponding to a differential pair of signal conductors is electrically isolated from the other signal connecting conductive via 152 of the pair. Further, for each pair of signal connecting conductive vias 152 corresponding to a differential pair of signal conductors, there is an area 158 surrounding the pair of signal connecting conductive vias 152 that is free of the ground plane 150. This free area 158 is sometimes referred to as an "antipad." It has been found that by ensuring that the area surrounding the pair of signal connecting conductive vias 152 is free of the ground plane 150 (while a region between adjacent pairs of signal connecting conductive vias 152 includes the ground plane 150), there is significantly improved signal performance. Note that while the preferred embodiment of the invention illustrates a substantially oval antipad 158, the antipad 158 may take other shapes. See, e.g., U.S. Pat. No. 6,607,402, incorporated by reference herein. For example, the antipad 158 may be substantially rectangular in shape or may be substantially figure-8 in shape.

As with the first contact ends 312 of each differential pair of signal conductors 310 of the first differential electrical connector 300 (FIGS. 4 and 5), one signal connecting conductive via 152 of a pair lies along a first line 160 and the other signal connecting conductive via 152 of the pair lies along a second line 162 that is parallel to and spaced from the first line 160. Also, as with the first contact ends 312 of each differential pair of signal conductors 310 of the first differential electrical connector 300, the signal connecting conductive vias 152 of a pair are offset. Preferably, the signal connecting conductive vias 152 of a pair are offset substantially at a forty-five (45) degree angle relative to the orientation of the rows 156a-156f. Note that because of this offset of the signal connecting conductive vias 152 of a pair, the antipad 158 surrounding the pair is also preferably oriented substantially at a forty-five (45) degree angle relative to the orientation of the rows 156a-156f.

The first ground launches 157 are also provided in the plurality of rows 156a-156f, as shown in FIG. 8A, for electrically connecting to a differential connector. For each of the rows 156a-156f, the first ground launches 157 are provided along a line 164 that is adjacent to and substantially parallel to the first and second lines 160, 162. Preferably, this line 164 is spaced between the first and second lines 160, 162. Further, for each of the rows 156a-156f, the number of first ground launches 157 is preferably greater than the number of pairs of first signal launches 155. In the example of FIG. 8A, the number of first ground launches 157 of a row 156a-156f is seven (7), while the number of pairs of first signal launches 155 of a row 156a-156f is six (6).

Referring now to FIG. 8B, there is shown the second signal launches 175 that are provided in a plurality of columns 176a-176f for electrically connecting to a differential connector. In the exemplary illustration of FIG. 8B, the six columns 176a-176f shown correspond to the six rows 330a-330f of differential pairs of signal conductors 310 of the first differential electrical connector 300 shown in FIGS. 4 and 5. These columns 176a-176f are orthogonal to the rows 156a-156f of FIG. 8A. This orthogonality of the rows 156a-156f on the first side 112 of the midplane 110 relative to the columns 176a-176f on the second side 114 of the midplane 100 corresponds to and accommodates the orthogonality of the daughtercards 130A-130C on the first side 112 relative to the daughtercards 120A-120D on the second side 114 (see FIG. 1).

Same as in FIG. 8A, each signal connecting conductive via 152 of a pair corresponding to a differential pair of signal conductors is electrically isolated from the other signal connecting conductive via 152 of the pair. In fact, the through-hole signal connecting conductive vias 152 shown in FIG. 8A are the same through-hole signal connecting conductive vias 152 shown in FIG. 8B. Thus, for the portion of the midplane 110 shown in FIGS. 8A and 8B, the number of first signal launches 155 equals the number of second signal launches 175. Note that by designing a differential electrical connector that provides a substantially square footprint for connecting to the midplane 110 (such as the first differential electrical connector 300), it is possible to provide the midplane 110 that utilizes the same through-hole signal connecting conductive vias 152 for connecting a differential electrical connector to the first side 112 and a differential electrical connector to the second side 114. In this manner, the midplane design of the present invention (i) significantly reduces the required layers and size of the midplane, (ii) provides for an easier to design and manufacture midplane, (iii) improves the signal characteristics of the transmitted signals, and (iv) significantly reduces the materials and cost of the manufactured midplane.

For each pair of signal connecting conductive vias 152 corresponding to a differential pair of signal conductors, there is an area 178 surrounding the pair of signal connecting conductive vias 152 that is free of the ground plane 170. This antipad 178 is similar to the antipad 158 of FIG. 8A. It has been found that by ensuring that the area surrounding the pair of signal connecting conductive vias 152 is free of the ground plane 170 (while a region between adjacent pairs of signal connecting conductive vias 152 includes the ground plane 170), there is significantly improved signal performance. Note that while the preferred embodiment of the invention illustrates a substantially oval antipad 178, the antipad 178 may take other shapes. For example, the antipad 178 may be substantially rectangular in shape or may be substantially figure-8 in shape.

As with the first contact ends 312 of each differential pair of signal conductors 310 of the first differential electrical connector 300 (FIGS. 4 and 5), one signal connecting conductive via 152 of a pair lies along a third line 180 and the other signal connecting conductive via 152 of the pair lies along a fourth line 182 that is parallel to and spaced from the third line 180. Also, as with the first contact ends 312 of each differential pair of signal conductors 310 of the first differential electrical connector 300, the signal connecting conductive vias 152 of a pair are offset. Preferably, the signal connecting conductive vias 152 of a pair are offset substantially at a forty-five (45) degree angle relative to the orientation of the columns 176a-176f. Note that because of this offset of the signal connecting conductive vias 152 of a pair, the antipad 178 surrounding the pair is also preferably oriented substantially at a forty-five (45) degree angle relative to the orientation of the columns 176a-176f.

The second ground launches 177 are also provided in the plurality of columns 176a-176f, as shown in FIG. 8B, for electrically connecting to a differential connector. For each of the columns 176a-176f, the second ground launches 177 are provided along a line 184 that is adjacent to and substantially parallel to the third and fourth lines 180, 182. Preferably, this line 184 is spaced between the third and fourth lines 180, 182. As described above, the columns 176a-176f of the second side 114 are orthogonal to the rows 156a-156f of the first side 112. Thus, the third and fourth lines 180, 182 are orthogonal to the first and second lines 160, 162 of FIG. 8A. For each of the columns 176a-176f, the number of second ground launches 177 is preferably greater than the number of pairs of second signal launches 175. In the example of FIG. 8B, the number of second ground launches 177 of a column 176a-176f is seven (7), while the number of pairs of second signal launches 175 of a column 176a-176f is six (6).

Figure 9A:
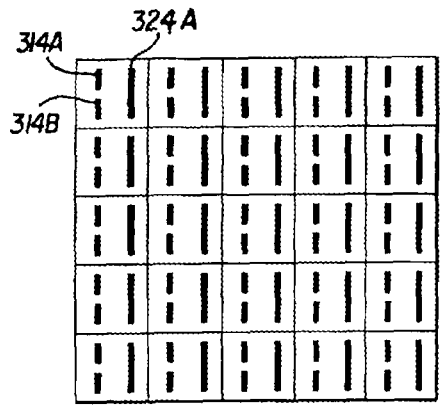
FIG. 9A is a schematic view of a cross-section through the mating contact region of a traditional differential midplane connector attached to one side of a midplane.

FIGS. 9A through 9D and FIGS. 10A through 10D illustrate the advantage of offset contact tails associated with the differential midplane connector 300 according to an embodiment the present invention. FIG. 9A illustrates a cross section through a traditional connector near the second contact end region. FIG. 9A shows that connector 300 has a pair-wise orientation. As used herein, "pair-wise" orientation indicates that the connector is designed with pairs of signal conductors adapted to preferentially electrically couple to each other. For example, the direction of the displacement between one conductor of a pair near the first contact end, e.g., 312(a), and the second conductor of the pair near the first contact end, e.g., 312(b), provides the orientation of the pair.

Multiple design techniques may be used to create a pair-wise orientation of a connector. These design techniques may be used alone or in combination. In the illustrated embodiment, shields are used to create preferential coupling between pairs. A pair-wise orientation is created because the signal conductors of each pairs are oriented in the connector with the signal conductors of a pair displaced from each other in a direction parallel to the shielding.

As another example of a technique to create a pair-wise orientation, the signal conductors of a pair may be routed closer to each other than to the next nearest signal conductor.

A pair-wise orientation is desirable for a differential connector because it increases the coupling between the conductors that form a pair and decreases coupling to signal conductors that form an adjacent pair. As a result, each differential signal path is less susceptible to extraneous electromagnetic fields that could induce noise. Further, the coupling between adjacent pairs is reduced, thereby reducing cross-talk within the connector, allowing the connector to operate with greater signal integrity. With greater signal integrity, more signals may be routed through the connector or signals of higher frequency may pass through the connector.

In FIG. 9A, second contact ends 314A and 314B forming a differential pair are aligned along column 910A. Such an alignment is similar to a connector 300 mounted on surface 112 to receive a connector on board 130A, such as shown in FIG. 1, with column 910A being aligned along an axis (shown here in the z axis) that is parallel to rows 330a-330f.

Figure 9B:
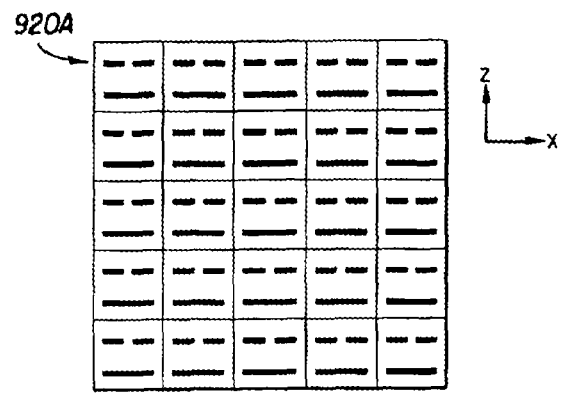
FIG. 9B is a schematic view of a cross-section through the mating contact region of a traditional differential midplane connector attached to the other side of a midplane as illustrated in FIG. 9A.
Figure 9C:
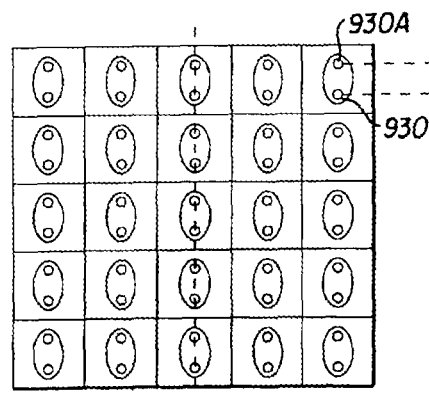
FIGS. 9C and 9D are diagrams illustrating via hole patterns for FIGS. 9A and 9B, respectively for traditional differential midplane connectors.

FIG. 9C shows a via hole pattern needed to receive first contact ends from signal conductors in a traditional connector mounted as shown in FIG. 9A if offset first contact ends are not used. FIG. 9C shows the hole pattern having the same alignment along an axis as the signal conductors for the connector in FIG. 9A, shown here in the z axis.

FIG. 9B shows a cross section of a connector with the second contact ends of a differential pair aligned along row 920A. Such an alignment is similar to a connector 300 mounted on surface 114 to receive a connector on board 120A, such as shown in FIG. 1, with row 920A being aligned along an axis (shown here in the x axis) that is parallel to rows 330a-330f. Because board 120A is perpendicular to board 130A, the pair-wise orientation and the alignment of the connector in FIG. 9B is orthogonal to the pair-wise orientation and the alignment of the connector in FIG. 9A.

Figure 9D:
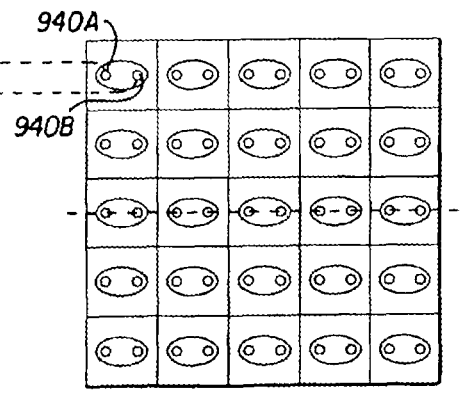

FIG. 9D shows a via hole pattern needed to receive first contact ends from signal conductors in a traditional connector mounted as shown in FIG. 9B if offset first contact ends are not used, FIG. 9O shows the hole pattern having the same alignment along an axis as the signal conductors for the connector in FIG. 9B, shown here in the x axis.

When the via hole patterns of FIGS. 9C and 9D are formed on opposite sides of a midplane, no amount of shifting of the hole pattern allows both holes for the same pair to be aligned. For example, if holes 930A and 940A are aligned, holes 930B and 940B cannot align. To connect a signal pair on one side of a midplane to another using a traditional connector design, routing traces within the midplane are required to make connections between the vias in which the connectors on opposite sides of the midplane are mounted.

Figure 10A:
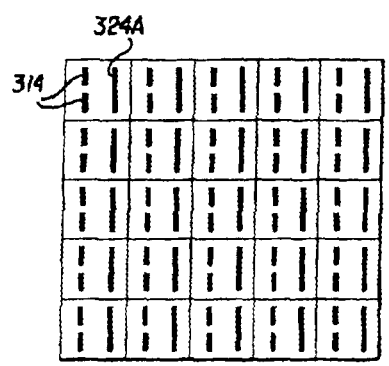
FIG. 10A is a schematic view of a cross-section through the mating contact region of a differential midplane connector attached to one side of a midplane according to an embodiment of the present invention.
Figure 10B:
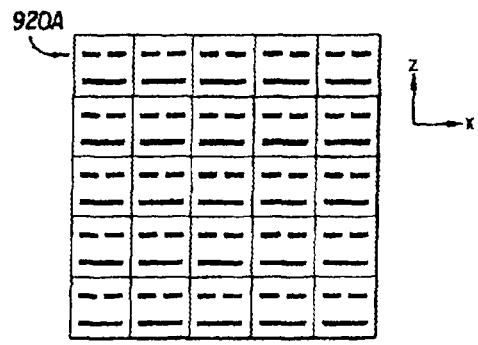
FIG. 10B is a schematic view of a cross-section through the mating contact region of a differential midplane connector attached to the other side of a midplane according to an embodiment of the present invention.
Figures 10C, 10D:
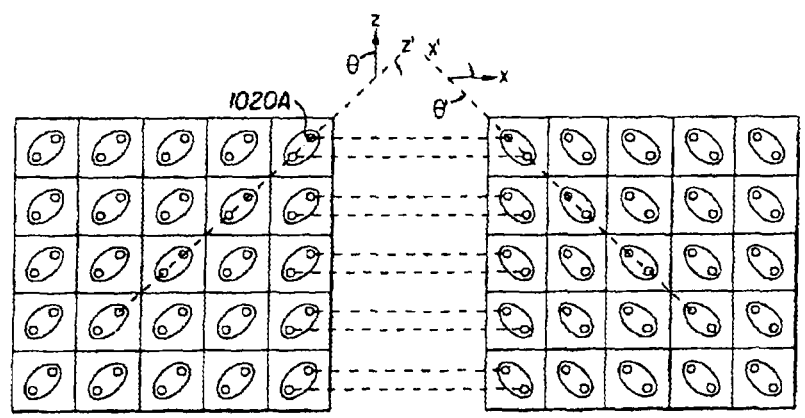
FIGS. 10C and 10D are diagrams illustrating via hole patterns for FIGS. 10A and 10B, respectively for differential midplane connectors according to an embodiment of the present invention.

FIGS. 10A through 10D illustrates an advantage that can be obtained with offset contact tails, 312(a), 312(b) according to an embodiment of the present invention. FIGS. 10A and 10B show the second contact ends 314A, 314B and 324A aligned along the same axes (shown here in the z and x axes, respectively) as previously shown in FIGS. 9A and 9B. With a forty-five (45) degree offset associated with the orientation of the contact tails 312(a), 312(b) from the second contact end position, there is a corresponding forty-five (45) degree offset for hole patterns associated with each differential pair. Thus, FIGS. 10C and 10D show via hole patterns needed to receive first contact ends 312(a) and 312(b) from signal conductors 310 as mounted in FIGS. 10A and 10B, respectively. FIG. 10C shows the hole pattern having an alignment along an axis z' that has an angle about forty-five degrees from the alignment (shown here in the z axis) of the second contact ends, 314 as shown in FIG. 10A. Similarly, FIG. 10D shows the hole pattern having an alignment along an axis x' that has an angle about forty-five degrees from the alignment (shown here in the x axis) of the second contact ends, 314 as shown in FIG. 10B. As a result, even though the mating contact portions 314 of connectors 300 on opposing sides of midplane 110 have orthogonal pair-wise orientations and alignments, the holes for differential pairs on opposite sides of midplane 110 have the same pattern and may be aligned. If the hole patterns on opposite sides of the midplane align, connectors in opposite sides of the midplane may be inserted into the same vias.

Figure 11B:
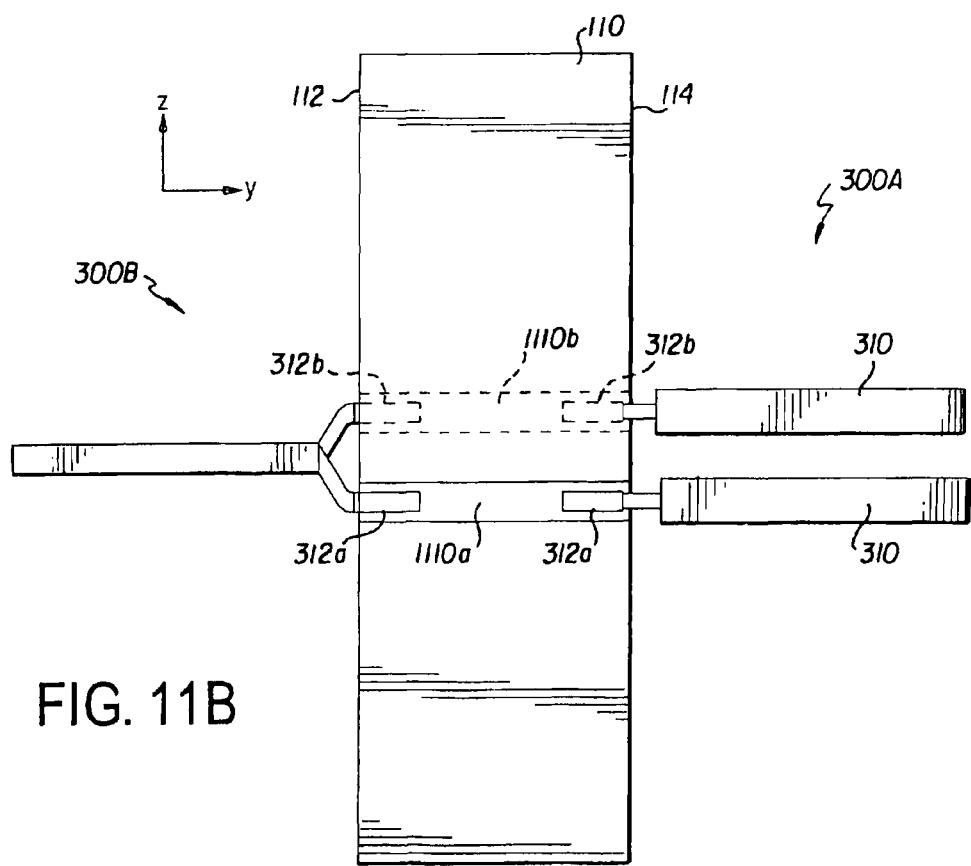
FIG. 11B is a schematic side view of FIG. 11A, showing two pairs of signal conductors each mounted on opposing sides of a midplane and sharing common vias according to an embodiment of the present invention.
Figure 11A:
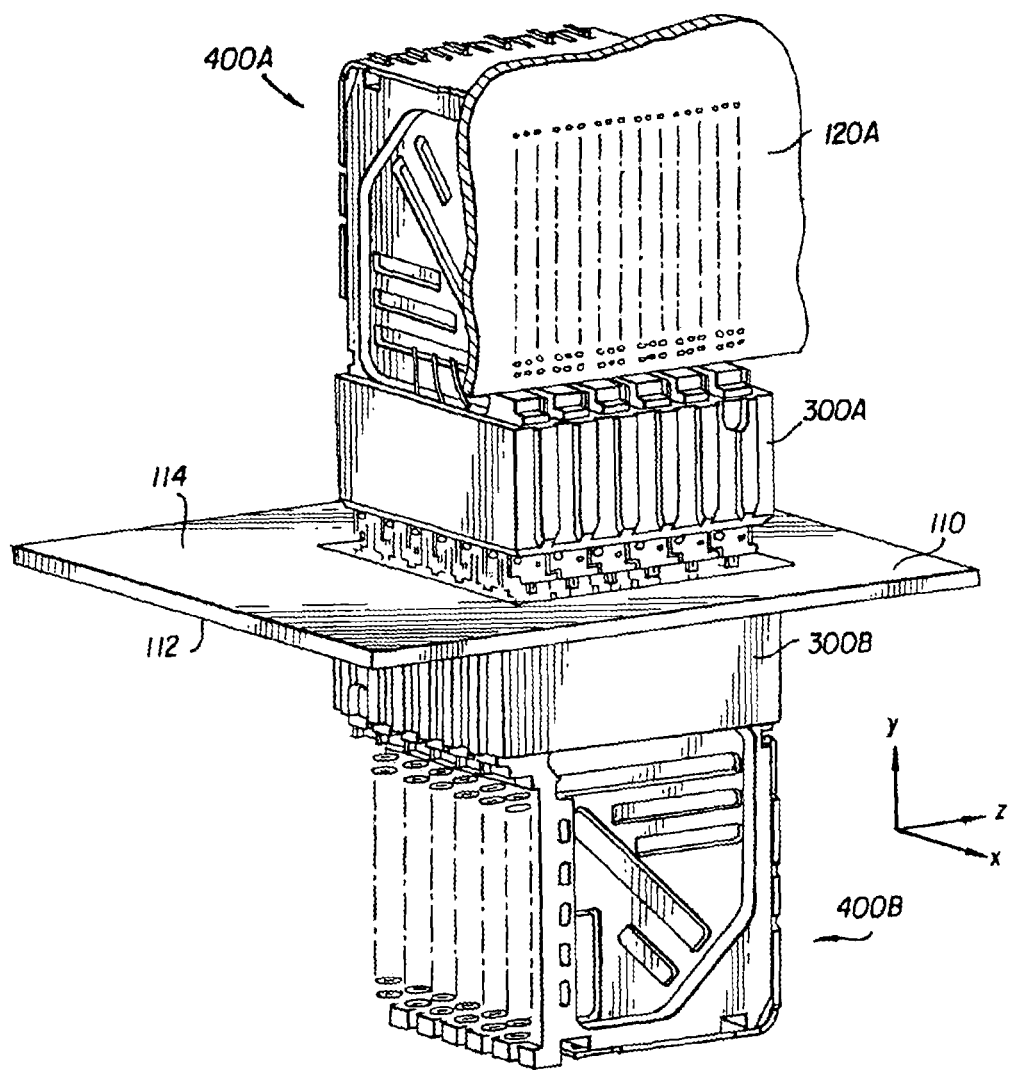
FIG. 11A is a perspective view of two differential electrical connector assemblies attached to opposing sides of a midplane according to an embodiment of the present invention.

This alignment is shown in FIG. 11A, which shows connectors 300A and 300B mounted on opposite sides of midplane 110. Connector 300A mates with connector 400A. Connector 300B mates with connector 400B. Because connectors 400A and 400B are attached to printed circuit boards that are mounted with different orientations, the pair-wise orientation of connectors 400A and 400B have different orientations. In the illustrated embodiment, connectors 400A and 400B are mounted orthogonal to each other. To mate with connectors 400A and 400B, connectors 300A and 300B must similarly be mounted orthogonal to each other, Consequently, connector 300A has a pair-wise orientation and alignment and connector 300B has a pair-wise orientation and alignment.

Despite the different pair-wise orientations of connectors 300A and 300B, the offset pattern of contact tails 312 allows the contact tails 312 of connectors 300A and 300B to be mounted using one set of via holes. Further, every pair of signal conductors in connector 300A may be mounted in the same two vias as a pair of signal conductors in connector 300B.

FIG. 11B is a side view of a pair of signal conductors within connectors 300A and 300B mounted on opposing sides of a midplane 110. The signal conductors have an orientation and alignment on one side of the board and an orientation and alignment on the opposing side. Despite orthogonal orientations, the offset of the contact tails of both pairs allows the contact tails to align so that they may be connected through vias 1110a and 1110b, respectively.

In this way, the two signals that form one differential signal are routed together from a daughter card on one side of midplane 110, through a first set of connectors to midplane 110, through midplane 110 to a second set of connectors to a second daughter card. The two signal conductors are kept together as a pair, thereby providing desirable signal integrity properties. Further, the transmission path may be optimized for carrying differential signals. As described above, each connector may be constructed with shielding, signal conductor positioning or other structures that provide a pair-wise orientation that increases the signal integrity when carrying differential signals.

In the midplane, connections between the signal conductors on opposing sides of the midplane may be made using only the vias of the midplane to carry the signal. No traces within the midplane are needed to carry differential signals from one side of the midplane to another. Eliminating traces, and transitions between vias and traces, within the midplane means less distortion of the signal occurs in the midplane, further increasing the signal integrity of the connector. Further, FIGS. 8A and 8B illustrate that ground clearances around differential pairs may be structured to further improve the integrity of signals passing through the midplane oriented as differential pairs.

A number of preferred and alternative embodiments of the invention have been described. Nevertheless, it will be apparent to one of ordinary skill in the art that various modifications and alterations of this invention may be made without departing from the scope and spirit of this invention. Accordingly, other embodiments are within the scope of the appending claims.

What is claimed is:

1. An interconnection system, comprising:
a printed circuit board comprising a first side, a second side opposite the first side, and a ground plane;
a plurality of vias extending from the first side to the second side of the printed circuit board in a plurality of rows and a plurality of columns;
a plurality of row electrical connectors configured to electrically connect with the printed circuit board on the first side of the printed circuit board, including a first row electrical connector configured to electrically connect with a first row and a second row of the plurality of vias;
a plurality of column electrical connectors configured to electrically connect with the printed circuit board substantially perpendicular to the row electrical connectors on the second side of the printed circuit board, including a first column electrical connector configured to electrically connect with a first column and a second column of the plurality of vias,
wherein the first row of vias and the first column of vias comprises a first via electrically connected to the first row electrical connector on the first side of the printed circuit board and the first column electrical connector on the second side of the printed circuit board,
wherein the second row of vias and the second column of vias comprises a second via electrically connected to the first row electrical connector on the first side of the printed circuit board and the first column electrical connector on the second side of the printed circuit board,
wherein the first via and the second via are surrounded by an area of the printed circuit board that is free of the ground plane.

2. The interconnection system of claim 1, wherein the first row of the plurality of vias comprises a third via electrically connected to the first row electrical connector on the first side of the printed circuit board and a second column electrical connector on the second side of the printed circuit board.

3. The interconnection system of claim 2, wherein the third via is electrically isolated from the first via.

4. The interconnection system of claim 1, wherein the first row electrical connector is configured to electrically connect with a second row of the plurality of vias and the second row of the plurality of vias comprises a third via configured to electrically connect with the first column electrical connector on the second side of the printed circuit board.

5. The interconnection system of claim 4, wherein the third via is electrically isolated from the first via.

6. The interconnection system of claim 1, wherein the plurality of vias comprises an equal number of rows and columns.

7. A printed circuit board having a first side, a second side opposite the first side, a ground plane, and a plurality of vias extending from the first side to the second side, the plurality of vias comprising:
a plurality of rows configured to electrically connect with a plurality of row electrical connectors on the first side of the printed circuit board, including a first row of vias and a second row of vias configured to connect to a first row electrical connector of the plurality of row electrical connectors;
a plurality of columns configured to electrically connect with a plurality of column electrical connectors on the second side of the printed circuit board, including a first column of vias and a second column of vias configured to connect to a first column electrical connector of the plurality of column electrical connectors, the plurality of column electrical connectors substantially perpendicular to the row electrical connectors,
a first via in the first row of vias and the first column of vias configured to electrically connect to the first row electrical connector on the first side of the printed circuit board and the first column electrical connector on the second side of the printed circuit board; and
a second via in the second row of vias the second column of vias configured to electrically connect to the first row electrical connector on the first side of the printed circuit board and the first column electrical connector on the second side of the printed circuit board
wherein the first via and the second via are surrounded by an area of the printed circuit board that is free of the ground plane.

8. The printed circuit board of claim 7, wherein the plurality of vias comprises an equal number of rows and columns.

9. The printed circuit board of claim 7, wherein the first row of the plurality of vias comprises a third via configured to electrically connect to the first row electrical connector on the first side of the printed circuit board and a second column electrical connector on the second side of the printed circuit board.

10. The printed circuit board of claim 9, wherein the third via is electrically isolated from the first via.

11. The printed circuit board of claim 7, wherein the plurality of rows further comprises a second row of the plurality of vias configured to electrically connect to the first row electrical connector on the first side of the printed circuit board and the second row of the plurality of vias comprises a third via configured to electrically connect with the first column electrical connector on the second side of the printed circuit board.

12. The printed circuit board of claim 11, wherein the third via is electrically isolated from the first via.

13. A printed circuit board, comprising:
a first surface;
a second surface opposite the first surface;
at least one ground plane layer having a plurality antipads formed therein; and
a plurality of pairs of adjacent vias formed between the first surface and the second surface positioned with a first pair-wise orientation on the first surface and a second pair-wise orientation transverse to the first pair-wise orientation on the second surface, the plurality of pairs being defined by the plurality of antipads such that each of the antipads contains only one of the plurality of pairs,
wherein the printed circuit board is configured to directly connect a first pair of signal conductors of a first connector on the first surface and a second pair of signal conductors of a second connector on the second surface through a pair of vias, and
wherein the plurality of vias extend through the ground plane layer.

14. The printed circuit board of claim 13, wherein the pair of vias is configured to electrically connect to a first pair of contact tails of the first pair of signal conductors of the first connector, each of the first pair of contact tails being inserted into one of the pair of vias through the first surface.

15. The printed circuit board of claim 13, wherein the pair of vias is configured to electrically connect to a second pair of contact tails of the second pair of signal conductors of the second connector, each of the second pair of contact tails being inserted into one of the pair of vias through the second surface.

16. The printed circuit board of claim 13, wherein the printed circuit board is configured to connect the first connector substantially perpendicular to the first surface and the second connector substantially perpendicular to the second surface and the first connector.

* * * * *